(12) United States Patent
Lee et al.

(10) Patent No.: US 6,534,221 B2
(45) Date of Patent: *Mar. 18, 2003

(54) METHOD FOR FABRICATING CONTINUOUS SPACE VARIANT ATTENUATING LITHOGRAPHY MASK FOR FABRICATION OF DEVICES WITH THREE-DIMENSIONAL STRUCTURES AND MICROELECTRONICS

(75) Inventors: Sing H. Lee, Del Mar, CA (US); Michael S. Jin, San Diego, CA (US); Miles L. Scott, San Diego, CA (US)

(73) Assignee: Gray Scale Technologies, Inc., San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/277,497

(22) Filed: Mar. 26, 1999

(65) Prior Publication Data

US 2003/0022070 A1 Jan. 30, 2003

Related U.S. Application Data

(60) Provisional application No. 60/079,890, filed on Mar. 28, 1998.

(51) Int. Cl.[7] .............................. G03F 9/00; G03C 5/00
(52) U.S. Cl. ........................ 430/5; 430/313; 430/317; 430/318; 430/323; 430/325; 430/296
(58) Field of Search .................... 430/5, 296, 942, 430/313, 317, 318, 325, 323

(56) References Cited

U.S. PATENT DOCUMENTS

| | | |
|---|---|---|
| 4,233,343 A | 11/1980 | Barker et al. |
| 4,839,251 A | 6/1989 | Ohta et al. ...................... 430/5 |

(List continued on next page.)

OTHER PUBLICATIONS

"The Evolution of Ion–Beam Diamond–like–Carbon Technology into Data Storage: Space Propulsion, Sunglasses, Sliders, and now Disks", Fred M. Kimock et al, Diamonex, Inc., Allentown, PA. http://www.fabtech.org/datatech/explore/downloads/02/069.pdf.

(List continued on next page.)

*Primary Examiner*—Mark F. Huff
*Assistant Examiner*—Saleha R. Mohamedulla
(74) *Attorney, Agent, or Firm*—Townsend and Townsend and Crew LLP

(57) ABSTRACT

A method for fabricating a mask for patterning a radiation sensitive layer in a lithographic printer is disclosed. An attenuating (absorptive or reflective) layer is coated over a substantially transparent base substrate such that after processing a two-dimensional spatially varying attenuating pattern is created with a continuously or discretely varying transmission or reflection function. In accordance with the present invention the two-dimensional attenuating pattern is formed by e-beam patterning of radiation sensitive layer to create a three-dimensional surface relief pattern. This pattern is transferred to the attenuating layer by an anisotropic etch, typically a directional reactive plasma etch. The attenuation of this radiation absorbing or reflecting layer varies with layer thickness. In one embodiment of this invention the attenuation of the mask would vary spatially in a continuous manner. In a second embodiment the attenuation of the mask (either reflective or absorptive) would vary spatially in discrete steps. One application of the mask created by this invention would be used to replicate a three-dimensional surface relief onto a second substrate by lithographic means. The replicated surface relief pattern could be used to store information, act as a mold for the formation of complex micro parts and to control etching of complex surfaces in micro optics, microelectronics and MEMS devices. The mask can be used as a phase shift mask to print high resolution profiles for the fabrication of microelectronics or to store and preserve images.

22 Claims, 19 Drawing Sheets

U.S. PATENT DOCUMENTS

| | | | |
|---|---|---|---|
| 4,895,780 A | 1/1990 | Nissan-Cohen et al. | 430/5 |
| 5,213,916 A | 5/1993 | Cronin et al. | 430/5 |
| 5,262,893 A | 11/1993 | Shrauger et al. | 359/565 |
| 5,285,517 A | 2/1994 | Wu | 385/142 |
| 5,310,623 A | 5/1994 | Gal | 430/321 |
| 5,480,764 A | 1/1996 | Gal et al. | 430/321 |
| 5,567,573 A | 10/1996 | Morton | 430/321 |
| 5,618,643 A | 4/1997 | Dao et al. | 430/5 |
| 5,668,023 A | 9/1997 | Goossen et al. | 148/33 |
| 5,670,096 A | 9/1997 | Lu | |
| 5,672,450 A * | 9/1997 | Rolfson | 430/5 |
| 5,876,902 A * | 3/1999 | Veneklasen et al. | 430/296 |
| 5,997,993 A | 12/1999 | Bi et al. | |
| 6,071,652 A * | 6/2000 | Feldman et al. | 430/5 |
| 6,288,842 B1 | 9/2001 | Florczak et al. | |
| 6,294,241 B1 | 9/2001 | Kaule et al. | |
| 6,303,058 B1 | 10/2001 | Kelley et al. | |
| 6,328,342 B1 | 12/2001 | Belousov et al. | |

OTHER PUBLICATIONS

"*Ion Beam and Ion–Assisted Deposition of Diamond–like Carbon Films*", S. Aisenberg et al., Material Science Forum vols. 52 & 53 (1989) pp. 1–40, Trans Tech Publications, Switzerland.

"*Plasma Deposited Thin Films*", J. Mort, Ph.D. et al., CRC Press, Inc., Boca Raton, Florida, 1988, pp. 87–127.3

* cited by examiner

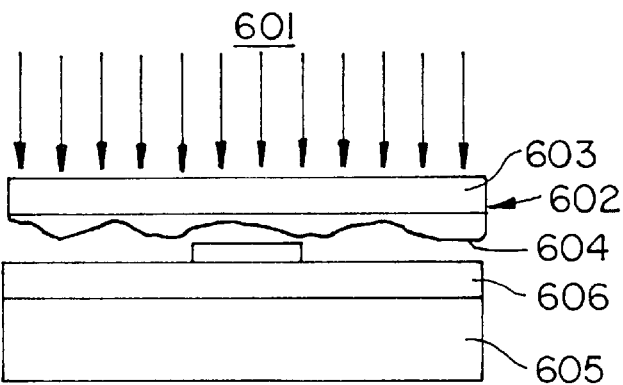
FIG. 20a
FIG. 20b
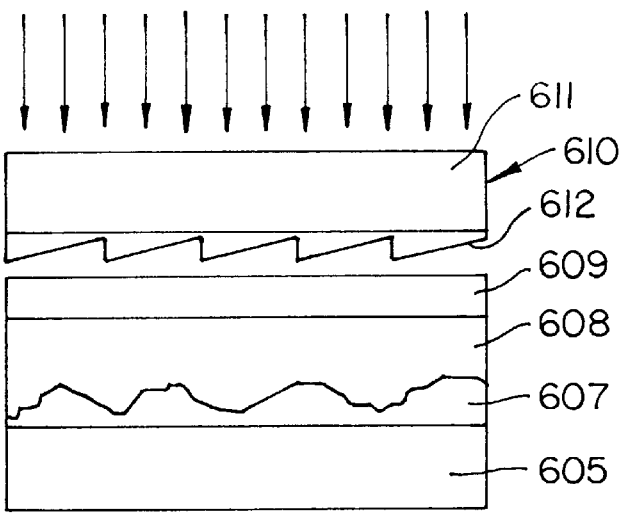
FIG. 20c
FIG. 20d
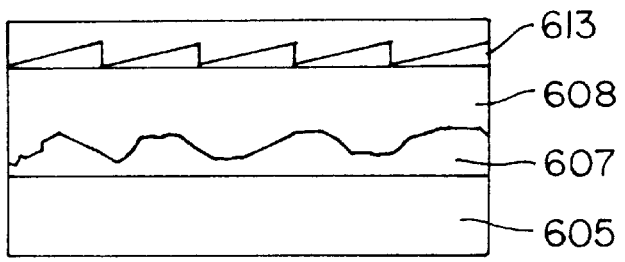
FIG. 20e
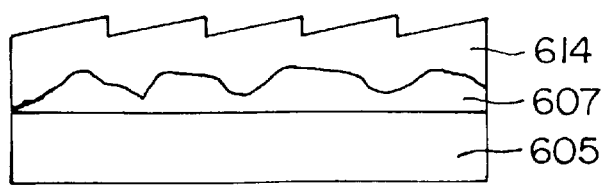

METHOD FOR FABRICATING CONTINUOUS SPACE VARIANT ATTENUATING LITHOGRAPHY MASK FOR FABRICATION OF DEVICES WITH THREE-DIMENSIONAL STRUCTURES AND MICROELECTRONICS This application claims the benefit of U.S. Provisional Application No. 60/079,890, filed Mar. 28, 1998.

FIELD OF THE INVENTION

The present invention relates to the field of lithographic printers used in patterning radiation sensitive layers which are used as stencils, molds, or etch control devices and the products made from such devices. More specifically the invention relates to a process for fabricating a mask with an attenuating layer where the thickness of the layer varies discreetly or in a continuous manner.

BACKGROUND OF THE INVENTION

Production of diffractive optical elements (DOE), computer generated holograms (CGH), and kinoform optics (KO) has previously been accomplished through multiple lithographic processing steps. A multistep method is not optimal because it is time consuming, complex, and because every step in the process creates an opportunity to introduce errors into the process (e.g. misalignment between lithographic steps). FIGS. 1a and 1f demonstrate a prior art multi-binary mask approach to fabricating a micro-optics using multiple lithographic masks.

In response to the recognized deficiencies of the multistep process, there has been a drive to develop a single step high resolution (0.1 to 1 micron) lithographic mask (with gray scale) and etch process for the production of such optical elements. Prior art approaches to developing gray scale attenuating masks have involved half tone, chrome on glass or variable e-beam exposure of ion implanted glass. To date, resolution due to e-beam scatter and lack of sensitivity to e-beam writing makes single-step gray scale masks very expensive to produce and of limited applicability. This lack of sensitivity requires extensive exposure time, and increases the manufacturing cost. Masks produced by this method currently cost many times that of binary masks produced by methods well known to practitioners skilled in the art. Further, with ion implanted glass the optical density of the material is limited by the density and thickness of the implanted layer (normally 3 to 10 microns), while the substrate material of glass is not transmissive below ~350 nm wavelength, which limits its application to the longer wavelength lithographic systems.

The present invention overcomes the limitations noted above and creates a lithographic mask that complies with the desired single step lithographic process for fabrication of the diffractive optical devices mentioned.

SUMMARY OF THE INVENTION

A mask and method of fabricating a mask for use in patterning a radiation sensitive layer in a lithographic printer is provided. The method requires providing a substrate and coating the substrate with a layer of radiation attenuating material. The attenuating layer may have phase shifting characteristics. The layer of radiation attenuating material is then coated with a layer of radiation sensitive material, which is exposed to radiation having an intensity or amplitude varying on an analog scale from a radiation source. After exposure, the layer of radiation sensitive material is developed to reveal a surface relief profile. The surface profile is transferred in the layer of radiation sensitive material into the layer of attenuating material by an anisotropic etch.

Utilizing the mask formed as described above, micro optics, micro-electrical mechanical systems and integrated circuits can be formed wherein these devices comprise a substrate having a surface with smoothly varying spatial contours having a pattern replicated from a mask with a spatially varying surface profile etched by an anisotropic etch.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

FIG. 2 is a flow diagram of the processing steps involved in the production of a multilevel diffractive optic of FIG. 1a.

FIGS. 20a–20e illustrate the process steps for fabricating a micro electrical mechanical system formed from stacked and bonded layers and constructed in accordance with the invention.

DETAILED DESCRIPTION OF THE PREFERRED EMBODIMENTS

Figure 1A:
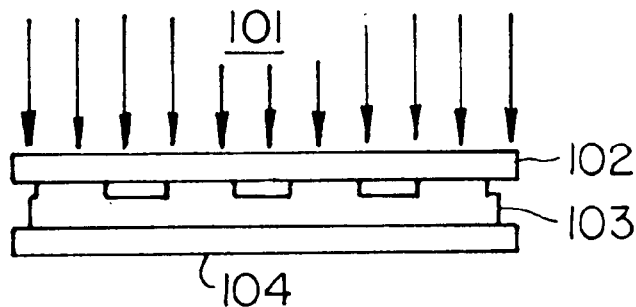
FIGS. 1a–1f illustrate the prior art process steps for fabrication of a multilevel diffractive optic using binary (opaque and transparent only) masks with contact lithography.
Figure 1B:
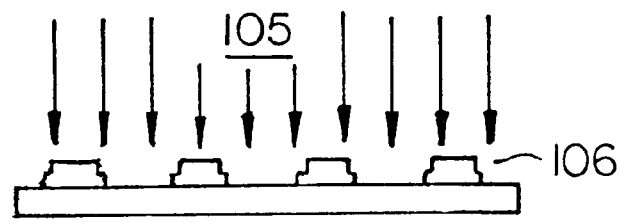
Figure 1C:
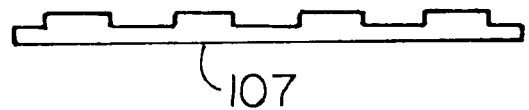
Figure 1D:
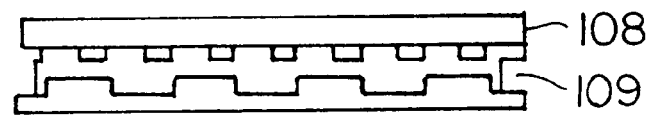
Figure 1E:
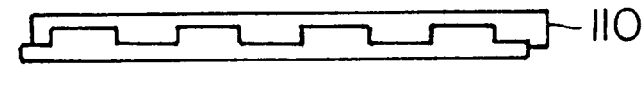
Figure 1F:
Figure 2:
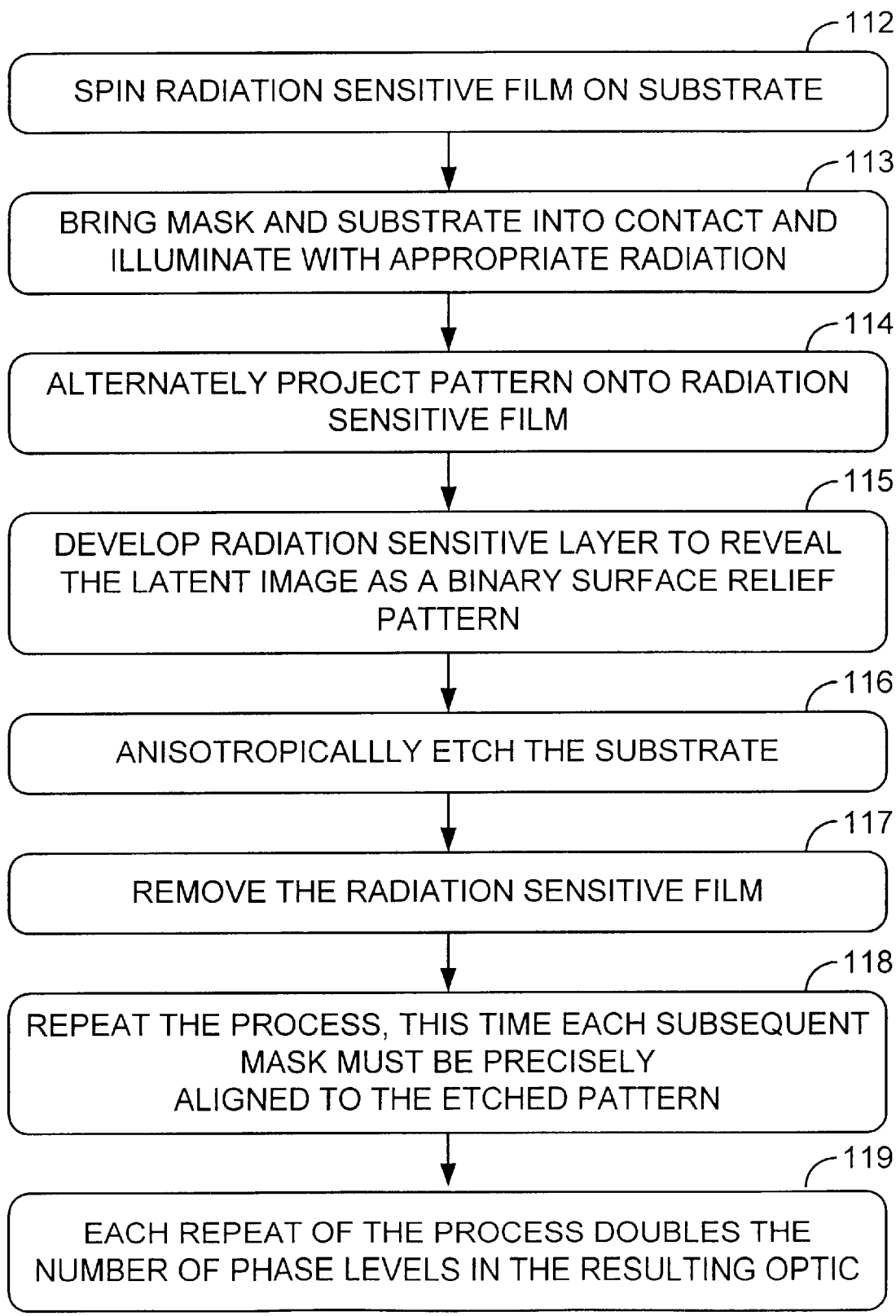
Figure 3A:
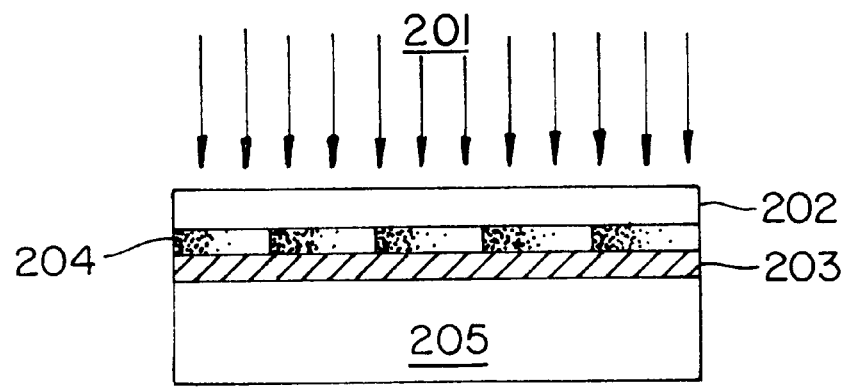
FIGS. 3a–3c illustrate the prior art process steps for fabrication of an analog diffractive optic using a high energy beam sensitive (HEBS) ion implanted gray scale mask.
Figure 3B:
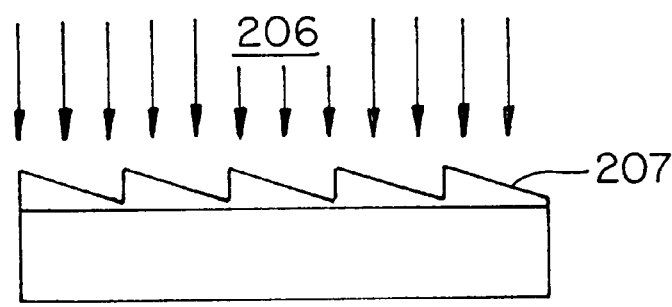
Figure 3C:
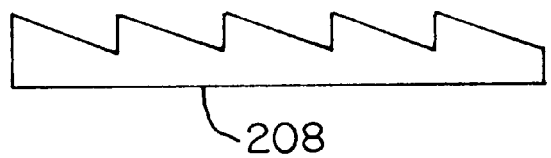
Figure 4:
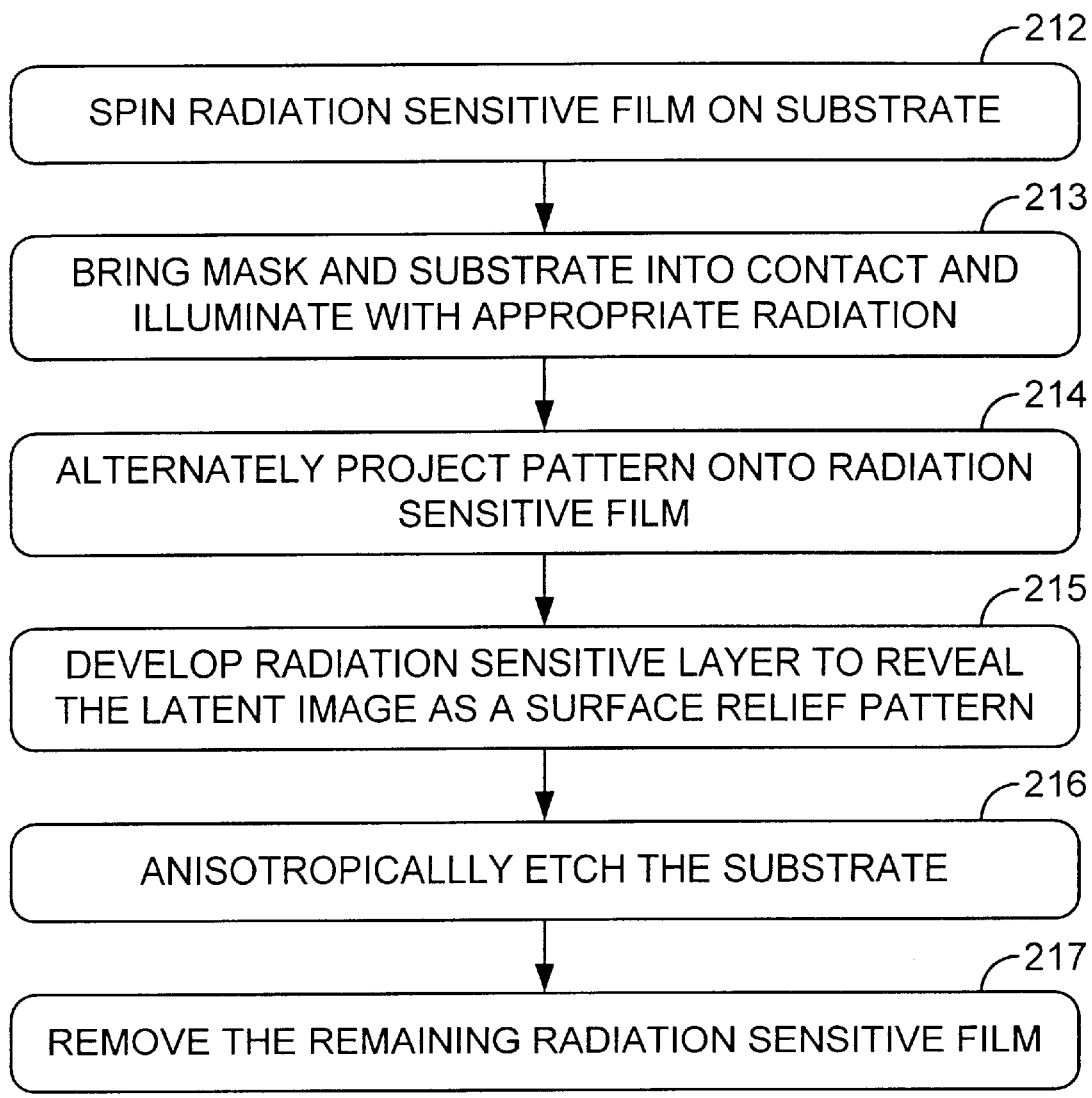
FIG. 4 is a flow diagram of the processing steps involved in the use of a gray scale mask of FIGS. 3a–3c.
Figure 5A:
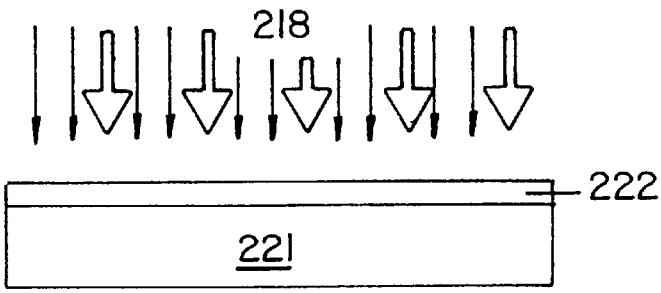
FIGS. 5a–5b illustrate the prior art processing steps involved in the fabrication of a gray scale mask using HEBS ion implanted glass.
Figure 5B:
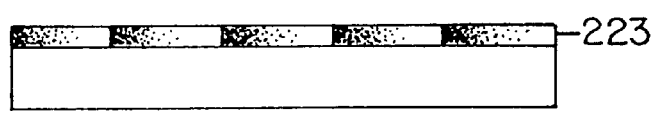
Figure 6:
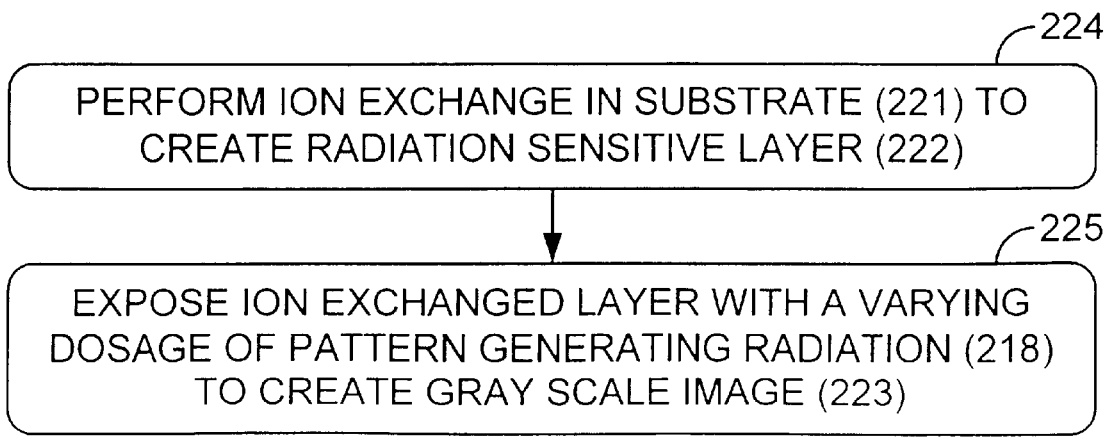
FIG. 6 is a flow diagram of the processing steps involved in the fabrication of the gray scale mask of FIGS. 5a–5b.
Figure 7A:
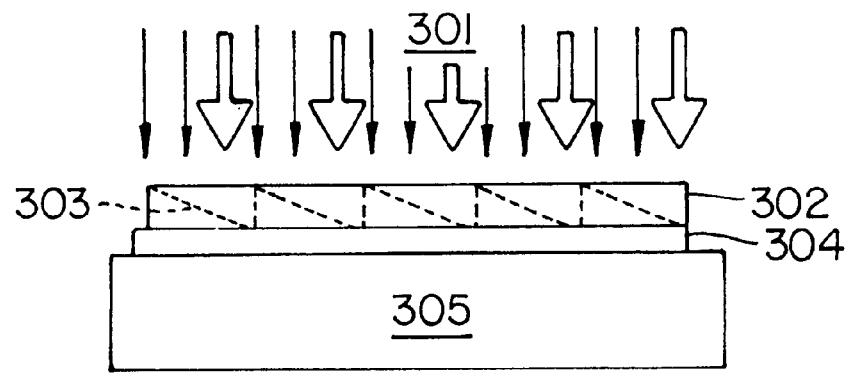
FIGS. 7a–7d illustrate by way of cross section the method of fabrication of the attenuating mask using the invention process.
Figure 7B:
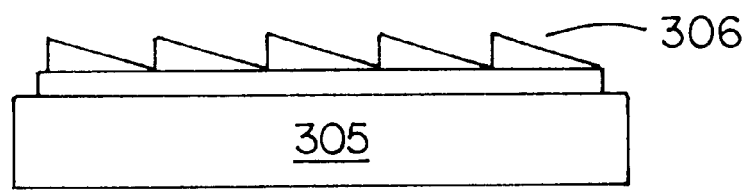
Figure 7C:
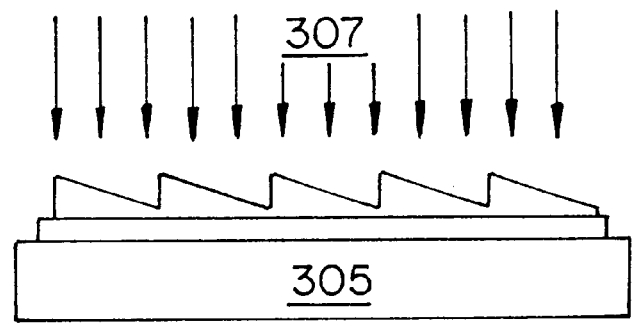
Figure 7D:
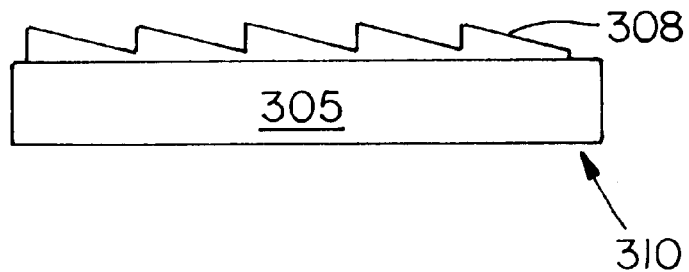
Figure 8:
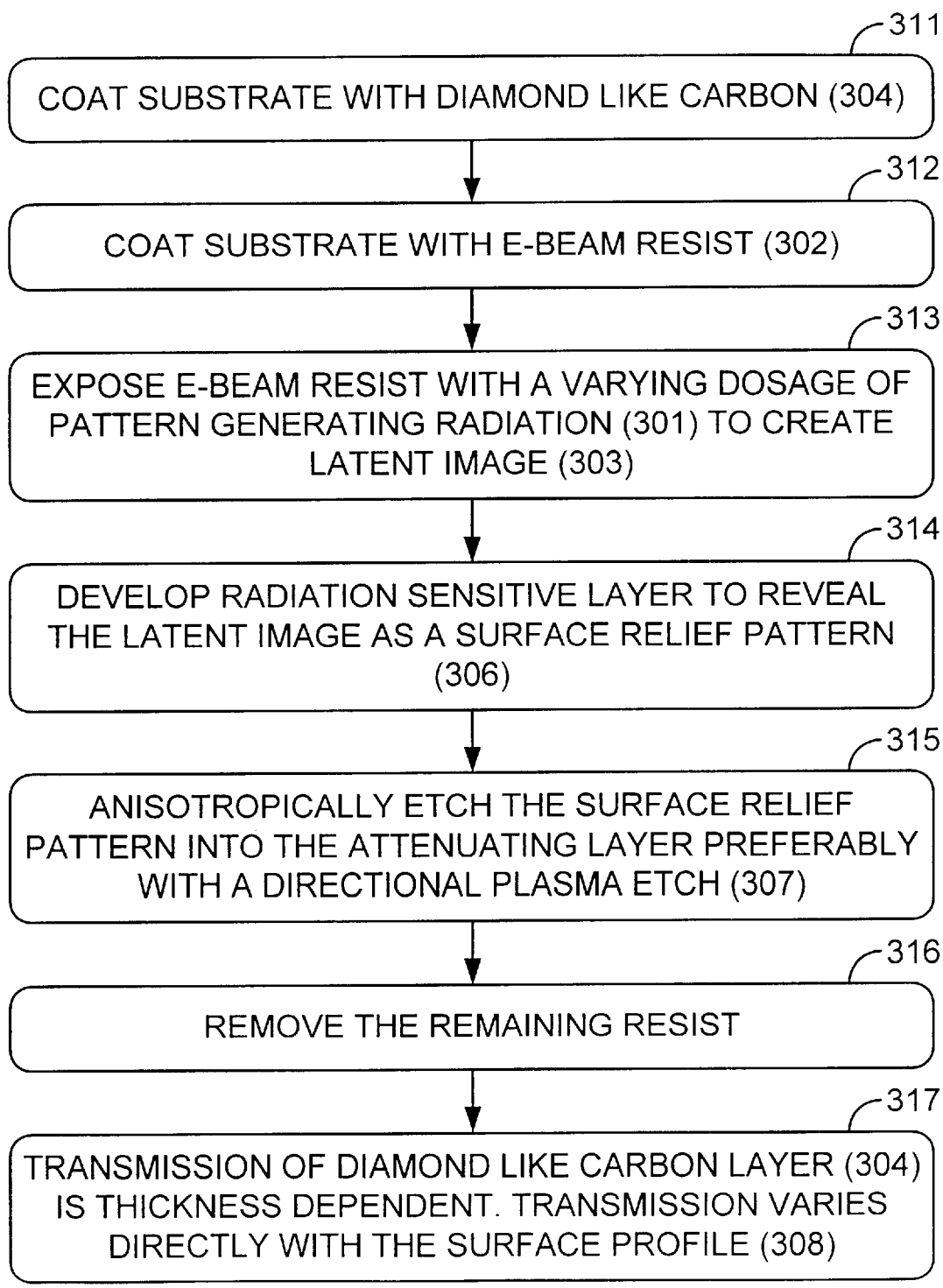
FIG. 8 is a flow diagram of the processing steps required for fabrication of the attenuating mask of FIG. 7d.

The present invention, in a general and overall sense, concerns a method for fabricating a mask for patterning a radiation sensitive layer in a lithographic printer. An attenuating layer is coated over a substantially transmissive substrate. This layer is next coated with a radiation sensitive layer, e.g. photoresist or e-beam sensitive resist. This resist layer is exposed to levels of radiation (e.g. laser or e-beam) varying on an analog or discrete scale. It will be apparent to those skilled in the art that this exposure step may be controlled through the use of computer hardware and software. The radiation sensitive layer is processed or developed to remove portions of the radiation sensitive layer material. The depth to which material may be removed from the radiation sensitive layer is directly or inversely related to the radiation exposure level in that area. Because the radiation may vary on an analog scale, smooth contours may be formed in the radiation sensitive resist layer. This surface contour profile is transferred using an anisotropic dry etching process to the attenuating layer to create a surface relief pattern of varying thickness. The thickness variations in the attenuating layer correspond to a varying transmission or reflection function. The attenuating layer may thus be used in such a manner as to record information or an image that may be used for various purposes. It will be apparent to those skilled in the art that the pattern to be recorded in the attenuating layer could be described by data stored on a computer system.

As an example of the utility of recorded information in the attenuated layer, when the attenuated layer is illuminated, the pattern on the attenuated layer may be reimaged onto another radiation sensitive layer (e.g. photoresist) on a separate substrate by an optical lithography system. This radiation sensitive layer may be processed to reveal a copy of the pattern recorded on the attenuated layer. The lithography system may magnify or minify the image during this process. The attenuating layer (when etched to varying thickness) may possess phase shifting characteristics that can be exploited for resolution enhancement similar to that of phase shifting masks. The attenuating material may allow the amplitude to be matched to the phase shift required by increasing the phase shift modulo $2\pi$ and increasing the thickness of the material.

The significance of this invention is in the simplicity of fabrication of masks and its improved characteristics. In contrast to HEBS glass, the radiation sensitive layer used is several times more sensitive to radiation, resulting in shorter write times and reducing manufacturing costs. The submicron attenuating layer used in the invention is also much thinner than the ion exchange layer of HEBS glass, which can be from 3 to 10 microns in thickness. This reduction in thickness of the attenuating layer reduces diffraction effects, allowing higher resolution printing. The substrate (e.g. excimer grade fused quartz or calcium fluoride) also allows transmission of radiation below 350 nm, which is below that of HEBS glass. Additional benefits and features of the present invention will be apparent from the detailed description, figures and claims set forth below. This invention has application in several areas of industry in addition to diffractive optics/micro-optics.

Semiconductor Industry

In the semiconductor industry there is a continuing effort to reduce the cost of integrated circuits/microelectronics and improving their performance. This invention is linked to two performance/cost factors, the size of the smallest set of lines that can be successfully printed and the cost of designing and fabricating the lithographic mask. In prior art processes, to form features for microelectronics, the mask or reticle is reimaged on a radiation sensitive film (e.g. photoresist in the step-and-repeat optical lithography process). After development, some of the film is completely removed and in other areas most of the film remains. In the open areas processing may be completed, while the area under the remaining film is protected from the process.

Microelectronics fabrication techniques today are capable of printing features that are smaller than 1 micron (submicron), and research continues to seek to print features even smaller. At these small sizes, diffraction of the small features in the mask can become the dominate effect, and is typically the limiting factor. Phase shift masks have been applied in the prior art to overcome these diffraction effects. One such example is set out in U.S. Pat. No. 5,618,643, Dao et. al. The present invention retains the performance features of the phase shift mask and can be designed for or applied to most wavelengths, while reducing the cost of fabrication.

Micro-Electro-Mechanical Systems (MEMS)/LIGA

MEMS devices are currently fabricated with binary masks, which severely limits the shapes that can be formed. The state of the art is to form very complex masks from numerous layers of constant thickness. The layer to layer thickness may change but the thickness within a layer remains nearly constant. This is much like cutting out layers of cardboard, and placing their flat sides together to build a three-dimensional structure. While a close approximation to any surface and volume can be obtained by this method, it is obviously very cumbersome as the structure becomes more complex. What is required is a method that allows for the fabricator to form smoothly varying contours, and to stack and bond these contours together. The present invention provides this capability.

Archival of Photographs

Archives find that some images are so important to history that they should be preserved for the life of the archive and beyond. However, photographic films and paints tend to deteriorate with time due to oxidation and attack by biological factors in the atmosphere. Diamond has a phenomenal life time and if photographic images were to be transferred into a diamond like film where the optical density could be varied by the thickness of the film, then one might well be able to store images for extremely long periods, possible many millennia. This invention provides the capability of archiving images in a thin variably opaque diamond film.

A method for fabricating a mask for patterning a radiation sensitive layer in a lithographic printer is disclosed. Referring to FIGS. 7a–7d and 8, in one embodiment a single radiation attenuating layer 304 is coated over a substantially transmissive substrate 305. Preferably, the substrate 305 is a material selected to provide transmission of radiation having wavelengths below ~350 nm. Alternatively, the subtrate 305 could be a reflective material such as metal. Suitable materials for the substrate 305 that provide transmission include quartz, such as excimer laser grade quartz, and calcium fluoride. Quartz and calcium fluoride, in contrast to glass, are able to transmit radiation below 350 nm. The attenuating layer 304 is either a radiation absorbing layer or a radiation reflecting layer. Suitable radiation absorbing materials include diamond-like carbon coatings and dielectrics. Suitable radiation reflective materials include single-layer metallic coatings or multilayers of alternating dielectric materials. The thickness of the attentuating layer is preferably from about 0.1 to about 1 micron in thickness, with about 0.1 to about 0.75 microns being preferred. The attenuating layer (304) is anisotropically etched to create a surface relief pattern (308) with a continuously varying thickness in such a manner to provide a mask designated generally at 310 to record information or an image that may be used for various purposes. The thickness of the single attenuating layer varies in a continuous or discrete manner depending on the design. The thickness variations in the attenuating layer 308 correspond to a varying transmission or reflection function when illuminated.

The surface relief profile 308 is reimaged by means of contact or projection printing, as shown in FIGS. 15a–15c and 16, by use of the lithographic tool 310 onto a radiation sensitive layer (403). The radiation sensitive layer 403 is processed (415) to reveal the image (404 and 407) recorded on the mask 310 (the combination of 305 and 308). The lithography system may magnify, minify, or in other ways modify the image during this process. Further, it will be apparent to those skilled in the art that this attenuating layer may possess phase shifting characteristics that can be exploited for resolution enhancement using the well developed art of phase shifting masks. In the following description, numerous specific details are set forth such as specific materials, mask patterns, dimensions, etc. in order to provide a thorough understanding of the present invention. It will be obvious to those skilled in the art, that the specific details need not be employed to practice the present invention. In other instances, well known materials or methods have not been described in detail to avoid unnecessarily obscuring the present invention.

Figure 9:
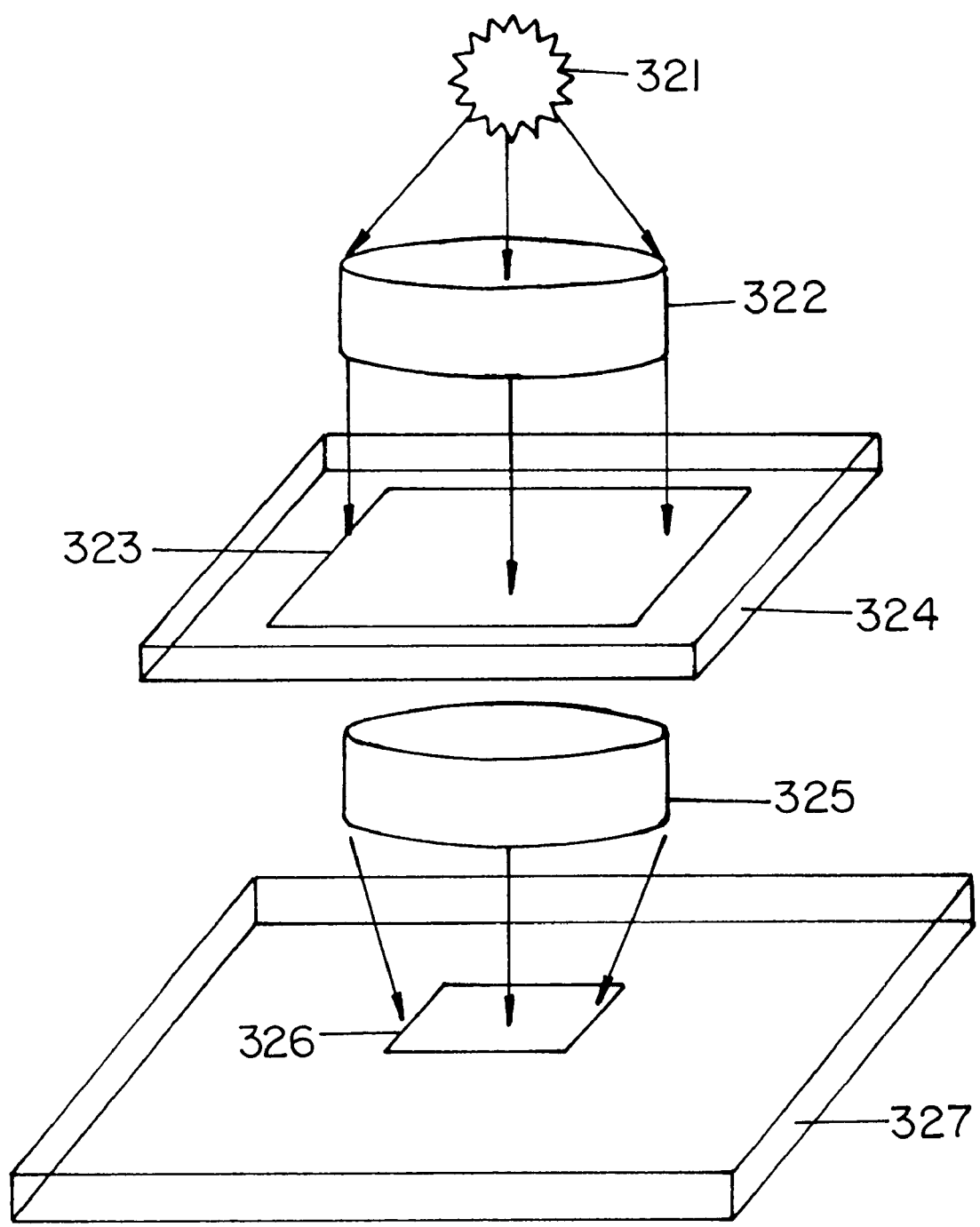
FIG. 9 is a schematic illustrating a method of creating a varying illumination pattern used for fabrication of an attenuating mask in accordance with the invention.
Figure 10:
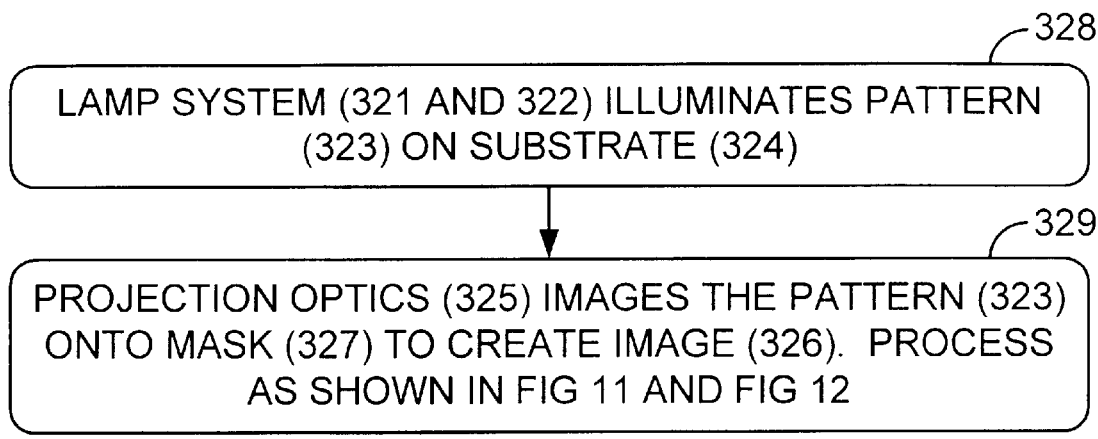
FIG. 10 is a flow diagram of the processing steps required for creating the illumination pattern of FIG. 9.
Figure 12:
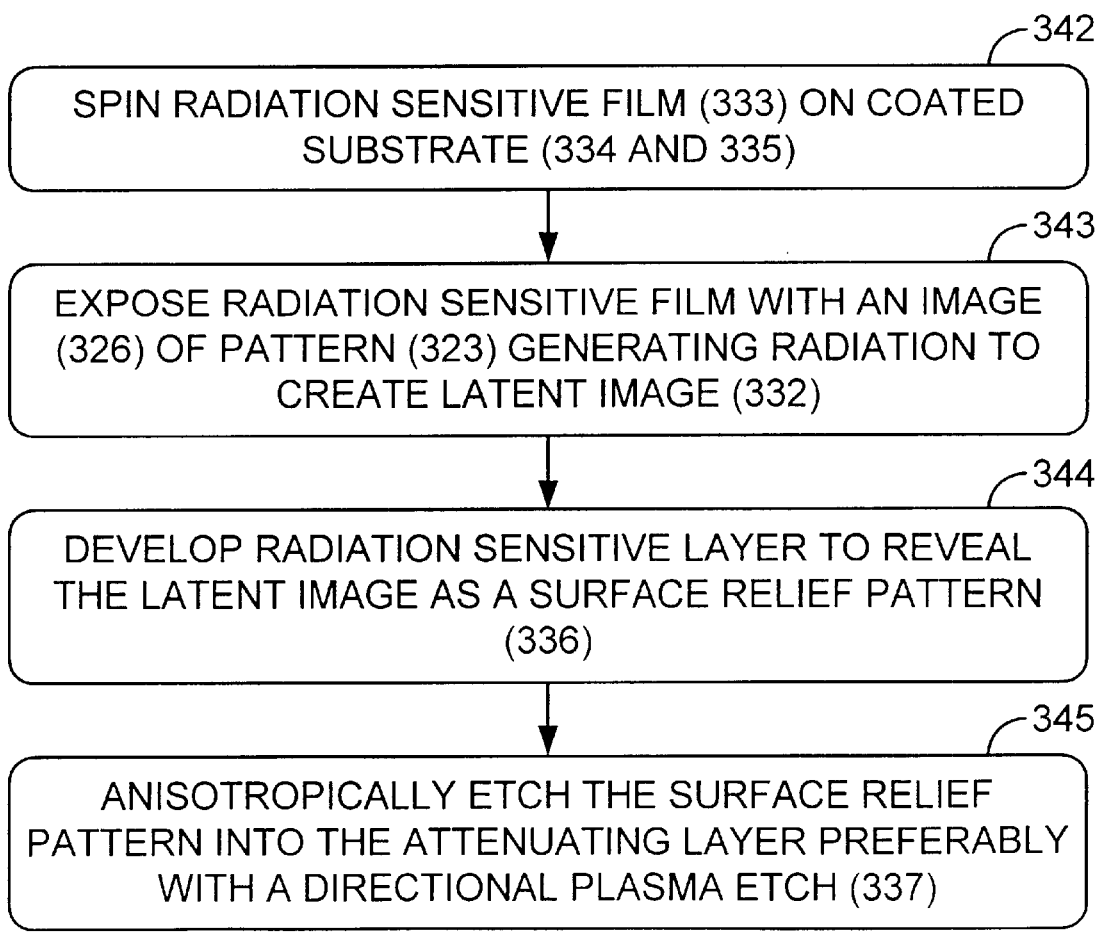
FIG. 12 is a flow diagram of the processing steps for fabricating the attenuating mask of FIGS. 11a–11d.
Figure 11A:
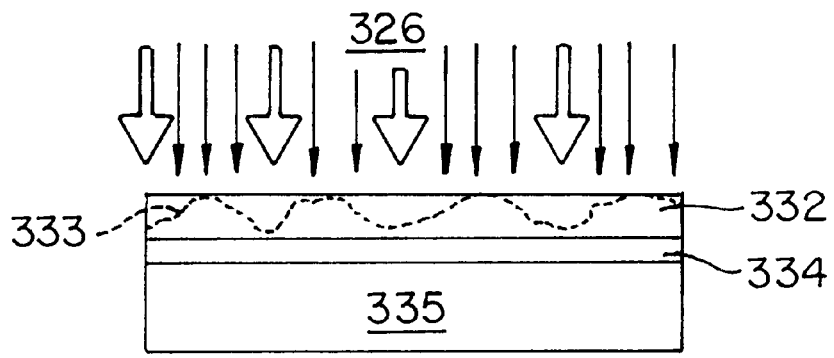
FIGS. 11a–11d illustrate a method of fabricating an attenuating mask in accordance with the invention.
Figure 11B:
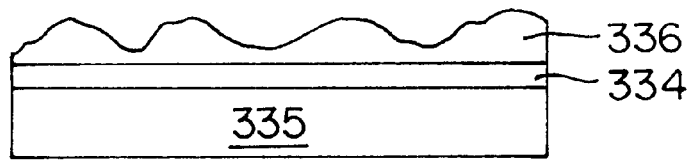
Figure 11C:
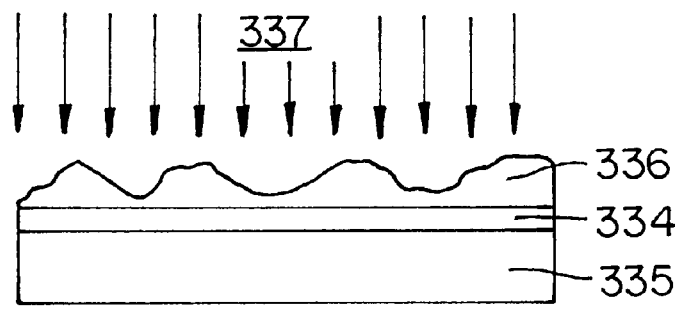
Figure 11D:
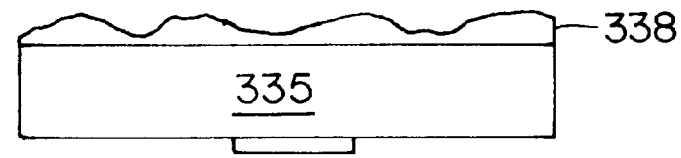
Figure 13A:
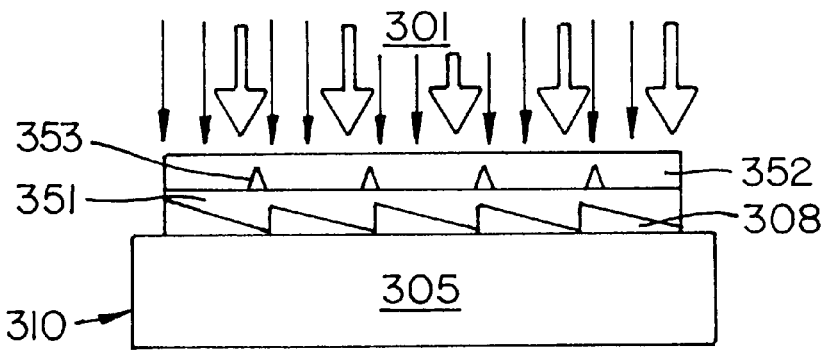
FIG. 13a–13c illustrate a method of fabricating an attenuating mask with an additional phase shifting layer in accordance with the invention.
Figure 13B:
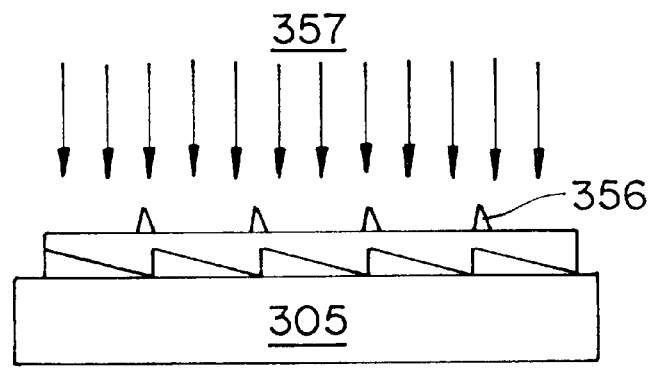
Figure 13C:
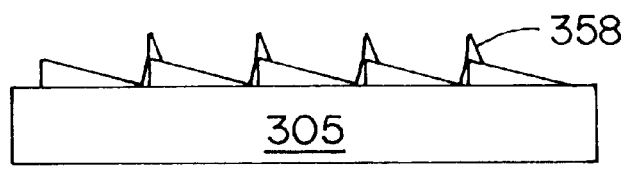
Figure 14:
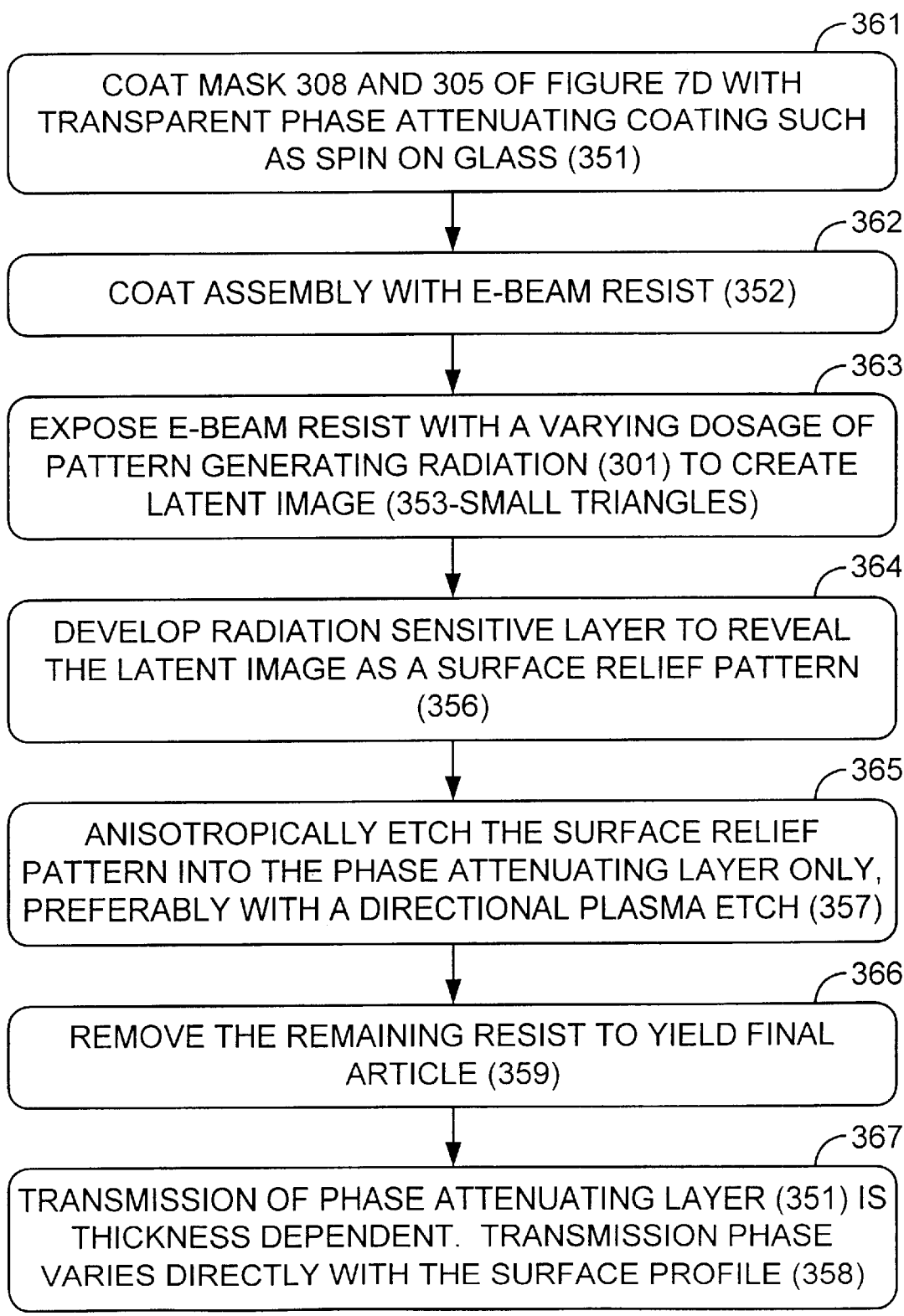
FIG. 14 is a flow diagram of the process steps for fabricating the attenuating mask of FIGS. 13a–13c.
Figure 15A:
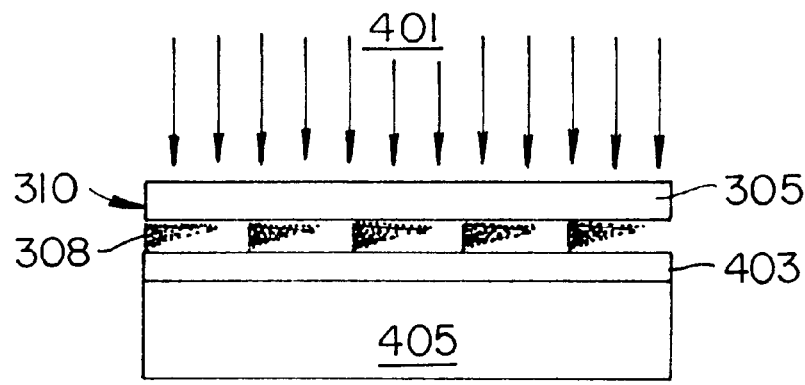
FIGS. 15a–15c illustrate the process steps for fabrication of an analog diffractive optic using an attenuating mask of the type fabricated by means of this invention.
Figure 15B:
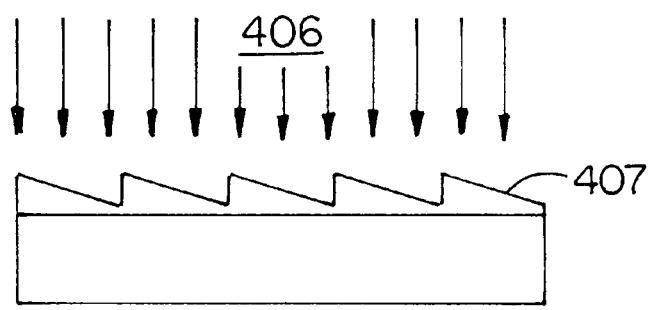
Figure 15C:
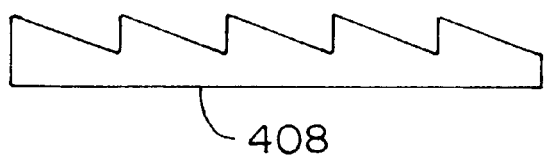
Figure 16:
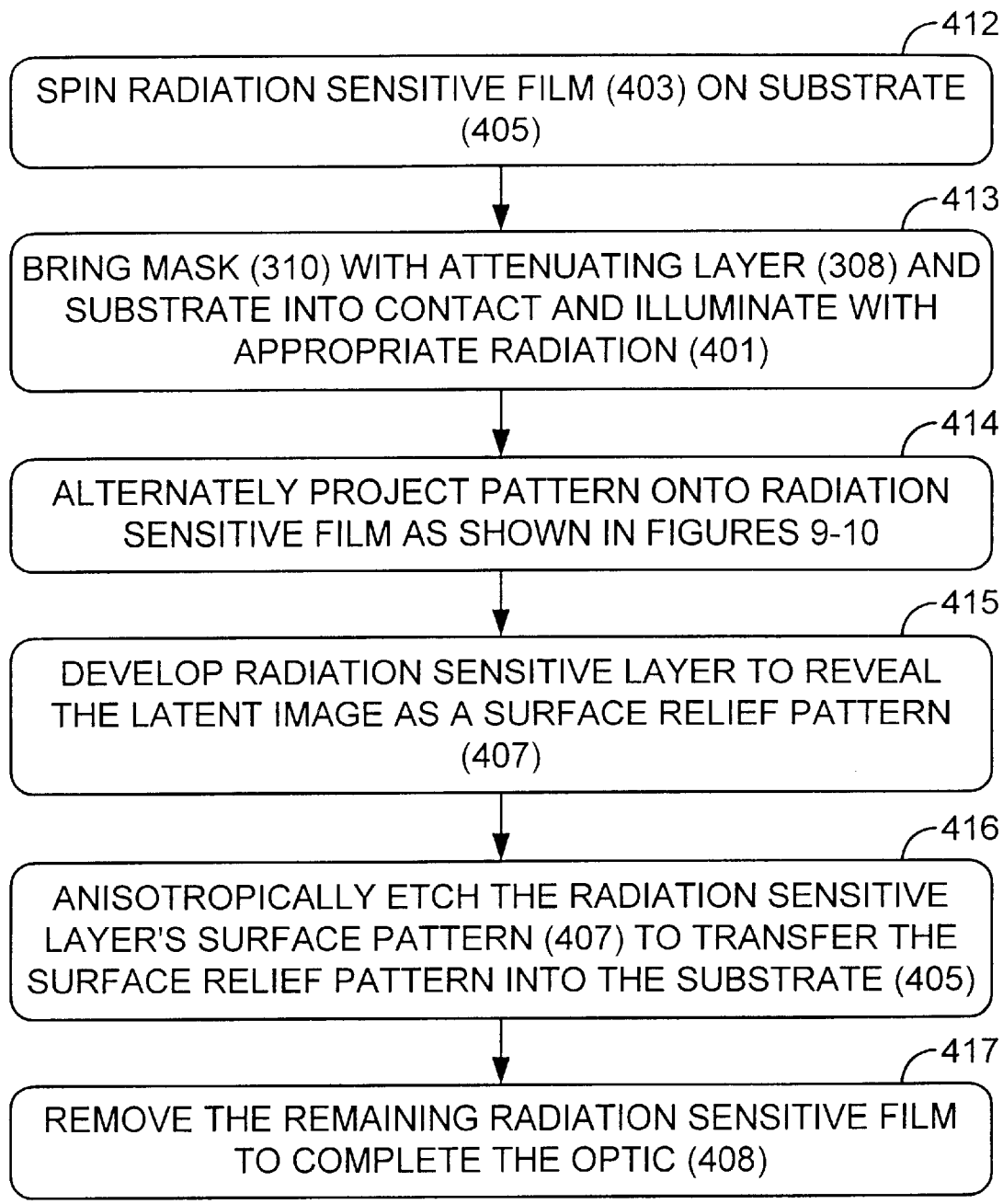
FIG. 16 is a flow diagram of the processing steps involved in the use of an attenuating mask, as of FIGS. 15a–15c.

FIGS. 15a–15c and 16 illustrate the use of the described invention for the fabrication of a diffractive optic or general three-dimensional surface by means of contact photolithography. In step 412, a substrate (405) of a suitable material for which an acceptable etch is known is selected and a radiation sensitive layer 403 is coated on it. Typically this will be a photosensitive resist which is coated by the method of spin coating. In step 413, for contact lithography the attenuating mask (310) is brought into intimate contact with the photoresist coated substrate. The assembly is illuminated as shown in FIG. 15a with a light source (401). Typically this light source is a collimated beam from an ultraviolet lamp. In step 414, the mask image is projected on to the photosensitive resist using various types and styles of lithographic projection tools, such as that shown in FIG. 9. In step 415, the photoresist is developed to reveal the surface profile (407). Commercial photoresists and developers (e.g. Shipley 1827 resist) used per the manufacturers' recommendations may be used in this step. In step 416, the substrate (405) with the developed photoresist (407) is placed in a vacuum chamber and etched by means of a plasma based anisotropic etch. During this etch the photoresist is eroded in a uniform manner until the substrate is revealed. Both the substrate and the resist are eroded in a uniform manner until such time as the fall pattern is transferred to the substrate (408). It is possible to increase or decrease the depth to which the attenuating layer is etched by controlling the flow of benign gasses during the etch process. In step 417, any remaining resist is removed and the device (408) with a three-dimensional surface relief pattern is ready for use or further processing.

If the three-dimensional surface relief pattern is designed to perform an optical function such as a Fresnel zone lens for focusing light then often the device is complete at this stage. However in many cases creating the surface relief pattern is only the first step in a complicated chain of processes. For example in the construction of micro-electro mechanical systems (MEMS) the device (408) might be used as a mold over which materials would be coated. The device (408) would be removed at some point later in the processing either by mechanical or chemical means.

Figure 19:
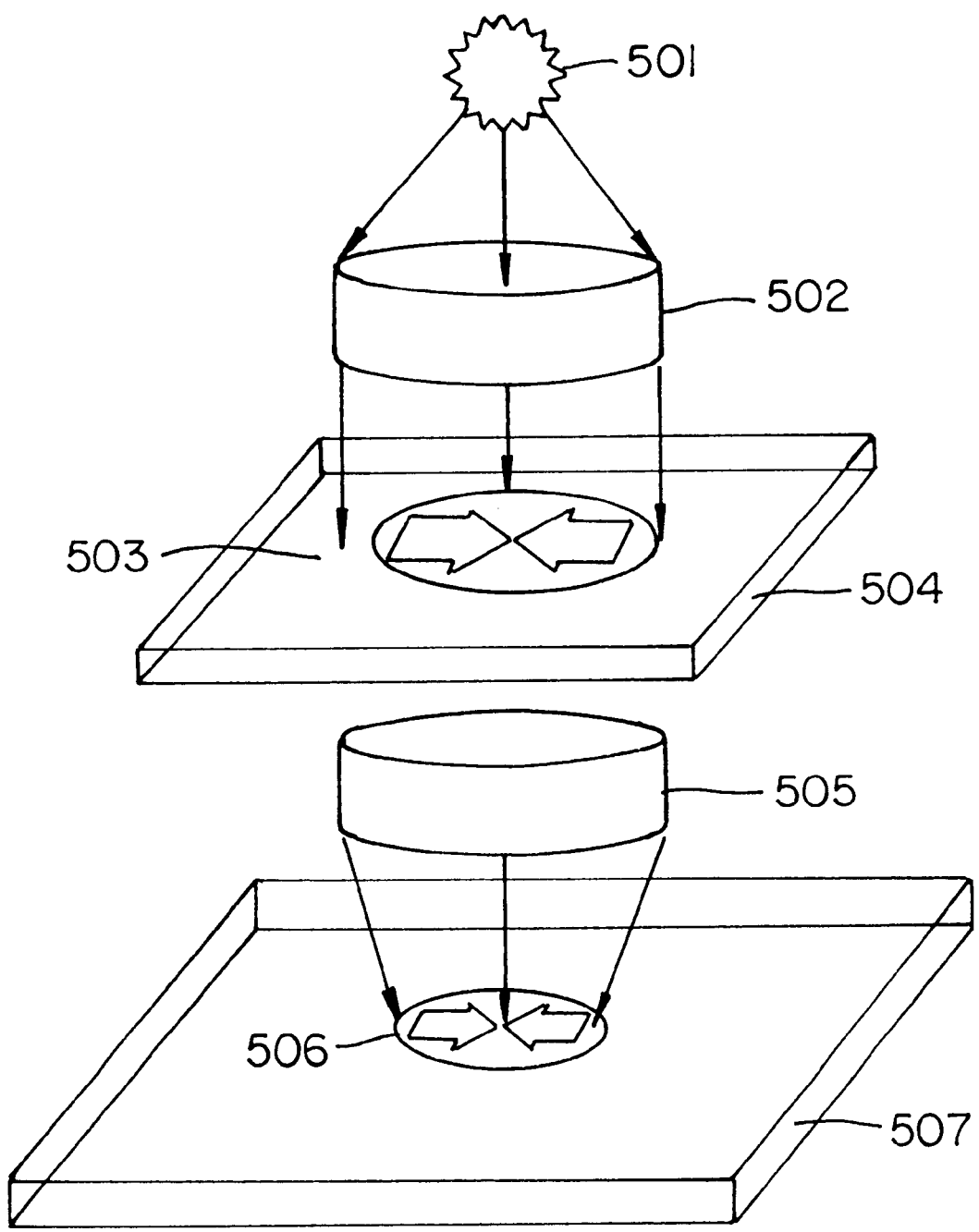
FIG. 19 illustrates an attenuating mask used for photographic archival.
Figure 21:
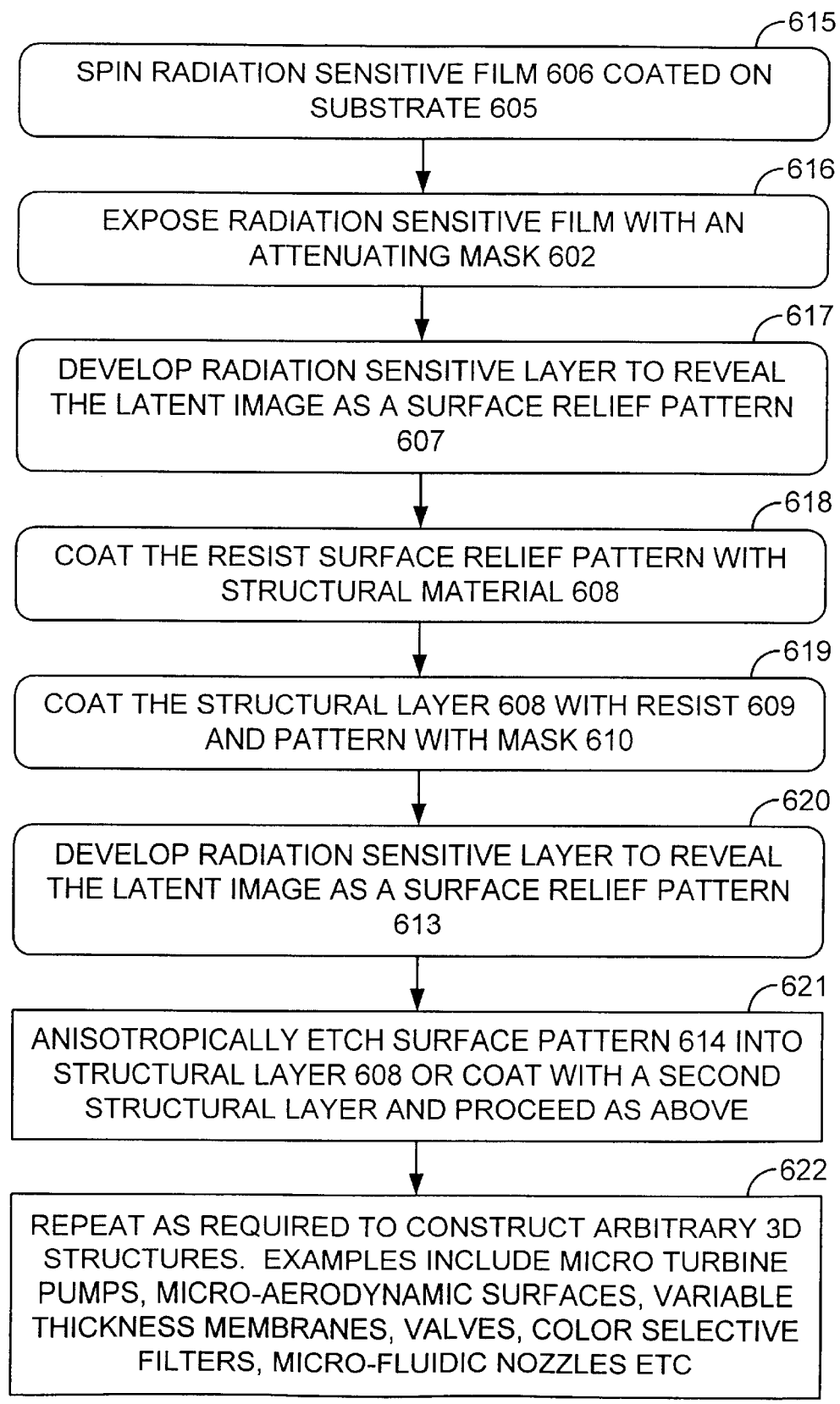
FIG. 21 is a flow diagram of the processing steps for fabricating the micro electrical mechanical system shown in FIGS. 20a–20e.

A second embodiment of the invention is disclosed which may be used for the archival and reproduction of photographic images. FIG. 19 shows the use of the attenuating mask for reproduction of an archived image (503). FIGS. 9–12 illustrate how the attenuating mask would be fabricated. In FIG. 19 illumination from a source (501) passes through optics (502 and 505) and the attenuating mask in such a manner as to be imaged onto a photosensitive film (507). This photosensitive film could be on any practical medium. After processing the film 507 will reveal a copy of the image which would be used for display of additional processing/replication. The advantage of using the attenuating mask for archival storage is that where attenuating diamond like films are used on quartz or sapphire substrates the data storage material has a nearly indefinite life time.

Figure 17A:
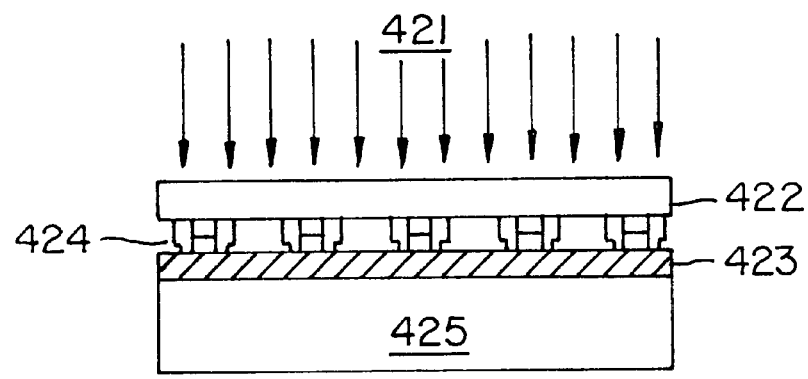
FIGS. 17a–17b illustrate the process steps for fabricating high resolution patterns by means of attenuating and phase shifting elements using an attenuating mask of the type constructed in accordance with the invention.
Figure 17B:
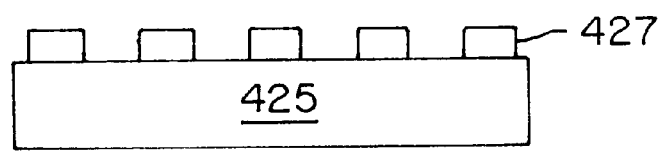
Figure 18:
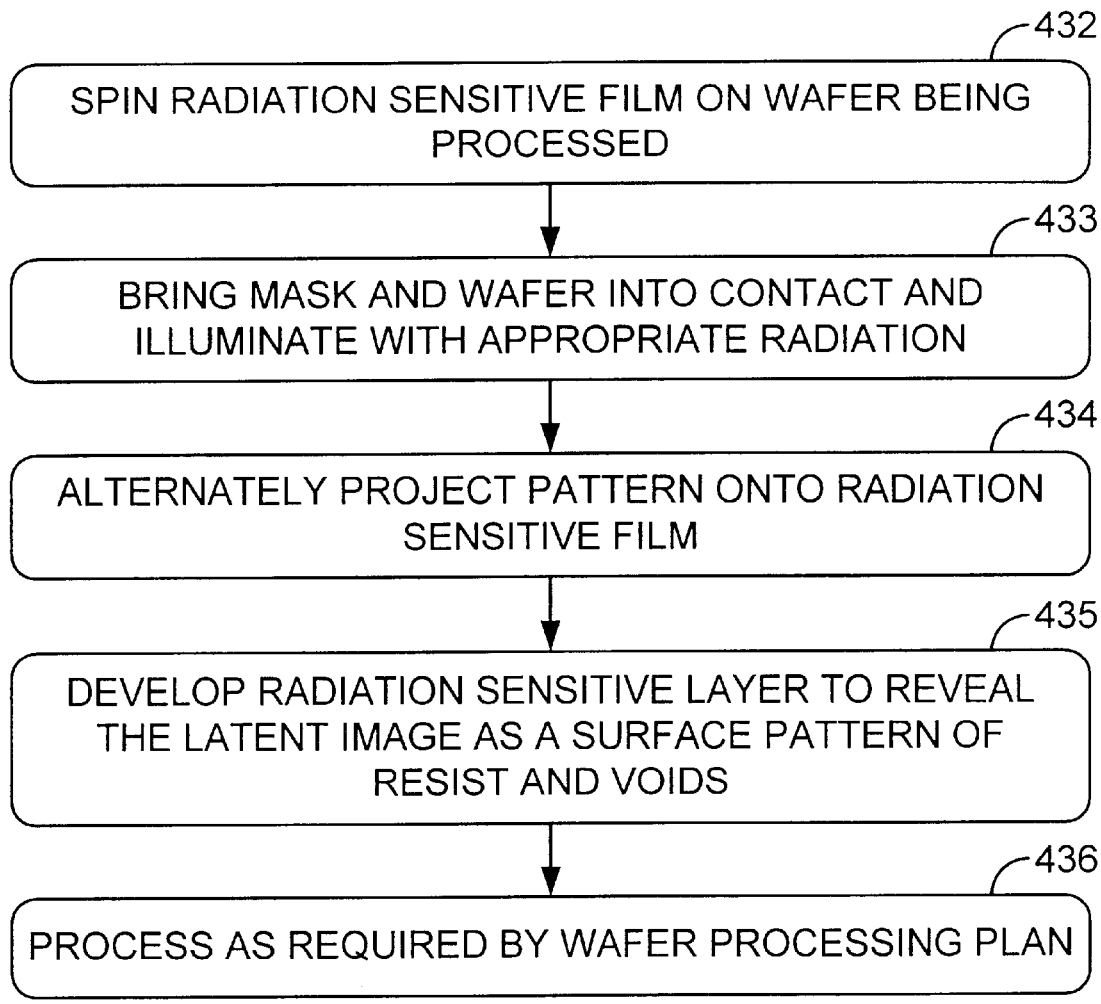
FIG. 18 is a flow diagram of the processing steps involved in the use of the attenuating phase shifting masks shown in FIGS. 17a–17b.

FIGS. 17a–17b and 18 illustrate the use of the continuous space variant attenuating lithographic mask for the fabrication of microelectronics. This description illustrates contact printing, but it should be noted that the most common practice is to use projection printing. Contact printing is illustrated for comparison with other examples. The fabrication of microelectronics involves numerous lithographic steps. In most of the steps the quality of the side wall profile and the accuracy of the replication of the designed feature width is critical to the performance of the device. Diffractions from sharp line/edges on the mask can cause the many detrimental effects in both the quality and verticality of the side wall, and unwanted variations in the width of the replicated feature.

This invention enables simpler processing of the several types of attenuating masks which have been developed to overcome these detrimental effects. The mask resulting from the embodied process would then be use for the fabrication of microelectronics or integrated circuits by replacement of existing art masks. The process for use would be as follows: In step 432, binary (not analog) photoresist (423) with high contrast is spun onto the wafer being processed (425). In steps 433, and 434, the mask pattern (424) is exposed/imaged onto the photoresist. In this case the image data on the mask could be designed to vary in a discrete or continuous manner. In step 435, the photoresist is developed to create voids through which further processing may be conducted. The remaining resist protects the underlying wafer structures during this processing. In step 436, as will be obvious to practitioners skilled in the art, further processing is then conducted as required to fabricate the microelectronic circuit desired. The advance of this invention is that phase shift is implemented in the attenuating layer to improve the characteristics of the resist cross section.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

EXAMPLE 1

The present invention will be illustrated with the use of features that vary continuously in a single attenuating layer of diamond-like carbon, using a positive electron beam or photo resist as the radiation sensitive layer (302) and electron beam (301) for the mask illumination source and an ultraviolet lamp (101, 201, and 401) for the lithographic system source. For those skilled in the art it will be obvious that this is not a limitation and could be practiced using other attenuating material, other resist systems, radiation sensitive layers, and illumination sources. Similarly, those skilled in the art will recognize that there are many substrate materials (305) which may be utilized, such as those discussed previously.

Referring to FIGS. 7a–7d and 8, in the present invention a gray scale image (303) is recorded on the mask's attenuating layer (304) by means of patterning a radiation sensitive layer (302) with a radiation source such as a focused beam of electrons, or photons (301). One suitable radiation sensitive is that available as Olin OEBR 514 electron beam. This resist is also sensitive to ultraviolet radiation, and may thus be patterned with an ultraviolet laser or other focused ultraviolet source. The electron beam resist (302) is exposed with varying dosages of the focused electron beam (301), where the thickness of the arrow represents the dosage received at that location (i.e. the dosage varies in a continuous manner from the higher dosage areas, thick arrows to the lower dosage areas, thin arrows).

To obtain a variation in the dosage or intensity of the radiation on an analog scale either the time the focused electron beam or radiation source remains at any position on the film (dwell time) or the current or intensity of the radiation beam (e-beam current) may be changed as a function of the position of the radiation source relative to the layer of radiation sensitive material. The intensity may also be varied by modulating the radiation source through the use of filters, which vary the intensity of the radiation. The e-beam resist is sensitive to the electron dosage and acceleration voltage of the electrons, which are deposited in the film (302). Higher acceleration voltage will give rise to higher energy electrons penetrating deeper into the resist. The radiation source may constitute, among other things, a focused electron beam, laser beam, or ion beam.

In the example a positive resist is used. In the positive resist areas of the resist that receive a greater number of electrons are removed to greater depth during development (306 and 314) than areas that receive fewer electrons. Thus, when the resist is developed a surface profile will be revealed in the resist (308) which represents the spatially varying exposure dosage (301). Alternatively, a negative resist could also be used. In contrast to the positive resist, in a negative resist areas that receive a fewer number of electrons are removed during development to a greater depth than those receiving a greater dosage of electrons.

After exposure, the resist (302) is developed using a developing solution suitable for the particular resist used. After development the latent image (303) is revealed as a surface relief profile (306). This profile varies in thickness in a continuous or discrete manner over the surface area that was exposed with the electron beam (301) and is directly related to the exposure dosage profile.

The resist coated mask is placed in a vessel for anisotropic etching. During anisotropic etching the surface relief pattern that is recorded in the resist 302 (mask radiation sensitive layer) is transferred into the radiation attenuating layer 304. The characteristic of anisotropic etching that makes it well suited to this purpose is that it will more or less faithfully replicate the shape of the profile into the material being etched. It is acknowledged by those skilled in the art that rounding of sharp edges may occur, and that magnification or minification may be experienced in the z-axis (i.e., perpendicular to the plane of the surface).

Reactive ion etching and chemically assisted ion beam etching (CAIBE) can be used to a perform this transfer etch. In CAIBE etching a plasma beam 307 of argon ions and a reactive gas, such as oxygen is directed toward the mask. These ions and reactive gas etch the resist layer (306) in a uniform manner until the material under the resist, the attenuating layer (304) is open to the ion and gas plasma. The plasma then begins to etch the attenuating layer 304. The depth of etch into both the resist and the underlying material is a function of the time of exposure to the ion and reactive gas plasma. An anisotropic etch is directional, allowing for faithful replication of the designed surface relief pattern. However, the etch rate of the resist and the underlying attenuating layer are generally not the same. Thus, the final surface profile may be extended or reduced on the z-axis.

The choice of attenuating material 304 is based on this etch rate differential and the application of the mask. For some applications the embodiment requires a thick attenuating layer with very high dynamic range; in other embodiments a thin layer is required with a lower dynamic range to match the optical density curve of the photoresist layer, where the image of the mask will be formed.

After the etch is completed any remaining resist is removed. Usually this will be outside of the patterned area. Inside the patterned area the resist is usually completely used up and only the etched attenuating layer (308) remains on the substrate (305). The surface pattern is now in the etched attenuating layer 308 and the transmission of any point on the mask 310 is determined by the dosage of electron beam that was written to the electron beam sensitive layer (e-beam resist) 302.

EXAMPLE 2

In a second embodiment of this process an image or hologram (323) would be projected onto a photosensitive layer (332) (FIGS. 9 through 12) through a series of optics (322 and 325). The projected data would be recorded as a latent image (333) (FIG. 11a) in the photosensitive layer. When this photosensitive layer is developed a surface relief profile (336) would be revealed that is proportional to the dosage of the illumination radiation (326) being projected onto the photosensitive layer.

With the exception of the manner of exposure this second embodiment is processed as was the first embodiment. After exposure the photosensitive layer (typically photoresist) is developed, the revealed surface relief profile is anisotropically etched into the attenuating layer (334) to record the image as second surface relief profile (338).

EXAMPLE 3

In a third embodiment of this process (FIGS. 13a–13c and 14) a second layer of attenuating material 351, designed to attenuate phase only, is coated on the mask 310 (combination of 308 and 305) prepared as shown in FIGS. 7a–7d and 8. This layer 351 is then processed as described in Example 1 or Example 2 wherein a pattern or image is written with an e-beam or optically projected onto a radiation sensitive layer. The pattern data would be recorded as a latent image 353 in the radiation sensitive layer 352. When this photosensitive layer 352 is developed a surface relief profile 356 would be revealed that is proportional to the dosage of the illumination radiation 301 being projected onto the photosensitive layer. This profile 356 varies in a continuous or discrete manner over the surface area that was exposed with the electron beam 301 and is a record of the exposure dosage.

The resist coated mask is placed in a vessel for anisotropic reactive ion etching (RIE). During this anisotropic etching the surface relief pattern that is recorded in the resist (mask radiation sensitive layer) is transferred into the phase shifting layer. The characteristic of anisotropic RIE etching that makes it well suited to this purpose is that it will more or less faithfuilly replicate the shape of the profile into the material being etched and that there are many materials like DLC that are not etched by the RIE chemistry that would be used to etch the phase shifting layer. It should be recognized that rounding of sharp edges may occur, and magnification or minification may be experienced in the z-axis (i.e., perpendicular to the plane of the surface). The depth of etch into both the resist and the underlying material is a function of the time of exposure to the ion and reactive gas plasma. An anisotropic etch is directional, allowing for faithful replication of the designed surface relief pattern. However, the etch rate of the resist and the underlying attenuating layer are generally not the same. Thus, the final surface profile may be extended or reduced on the z-axis.

The choice of both the amplitude and phase attenuating materials is based on their etch rate differentials (the ability of the first layer to act as an etch stop for the second), their refractive indices, and the application of the mask. For some applications the embodiment requires a thick phase shifting layer with very low refractive index; in other embodiments a thin layer is required with a higher refractive index to obtain the required phase shift and attenuation for the design application.

After the etch is completed any remaining resist is removed. Usually this will be outside of the patterned area. Inside the patterned area the resist is usually completely used up and only the formed attenuating layer (358) remains on the substrate (305). The surface pattern is now in the phase shifting layer and the phase of illumination passing through any point on the mask is determined by the dosage of electron beam that was written to the electron beam sensitive layer (e-beam resist).

EXAMPLE 4

FIGS. 20a–20e and 21 illustrate another embodiment wherein a micro electrical mechanical system is formed. The MEMS is fabricated by forming smoothly contoured layers that are stacked and bonded together. As shown in FIG. 20a, a substrate 605 is coated with a radiation sensitive film layer 606. This is exposed to radiation 601 through an attenuating mask 602 formed as described previously having a transmissive substrate 603 and a contoured attenuating layer 604. The exposed radiation sensitive layer 606 is then developed to remove a latent image as a surface relief pattern 607 (FIG. 20b). At this point the surface relief pattern 607 may optionally be anisotropically etched so that the image is replicated in the substrate 605. In the instance shown, the surface relief pattern 607 is coated with a structural material 608, as shown in FIG. 20c. A second layer of resist 609 is coated on the structural material 608. This is also patterned with a pattern or image from a second mask 610 (FIG. 20c) formed from attenuating layer 612 and transmissive substrate 611. The resist 609 is then developed to reveal the latent image 613 (FIG. 20d) from mask 610 and the structural layer 608 is anisotropically etched to form continuously contoured surface pattern 614, as shown in FIG. 20e. Optionally, the latent image 613 can be coated with a second structural layer (not shown) that is processed as described above. This process can be repeated as necessary to form the desired three-dimensional structure. Various micro mechanical or electrical devices can be formed using this process, including micro turbine pumps, micro-aerodynamic surfaces, variable thickness membranes, valves, color selective filters, micro-fluidic nozzles, etc.

The materials and method of fabrication of the present invention have been described with specific examples and embodiments thereof. It will however, be evident that various modifications and changes may be made thereto without departing from the broader spirit and scope of the present invention. The present specifications and drawings are accordingly to be regarded as illustrative rather than restrictive.

What is claimed is:

1. A method of fabricating a mask for use in patterning a radiation sensitive layer in a lithographic printer comprising the steps of:

a. providing a substrate;

b. coating the substrate with a layer of attenuating material;

c. coating the layer of attenuating material with a layer of radiation sensitive material;

d. exposing the layer of radiation sensitive material to radiation of dosage varying on an analog scale from a radiation source;

e. developing the exposed layer of radiation sensitive material to reveal a surface relief profile having a varying thickness, the thickness of the surface relief profile corresponding directly or inversely to the dosage of radiation; and f. transferring the surface relief profile in the layer of radiation sensitive material into the layer of attenuating material by an anisotropic etch.

2. The method of claim 1, wherein:
the layer of attenuating material is a radiation absorbing material.

3. The method of claim 1, wherein:
the layer of attenuating material is a radiation reflecting material.

4. The method of claim 1, wherein:
the layer of attenuating material is further defined as having discretely spatially varying thickness after the anisotropic etch.

5. The method of claim 1, wherein:
the substrate is a transmissive material.

6. The method of claim 1, wherein:
the substrate is a reflective material.

7. The method of claim 1, wherein:
the layer of attenuating material is further defined as having continuously spatially varying thickness after the anisotropic etch.

8. The method of claim 1, wherein:
the layer of attenuating material is further defined as having both discretely and continuously spatially varying thickness after the anisotropic etch.

9. The method of claim 1, wherein:
the layer of radiation sensitive material is further defined as a layer of positive radiation sensitive material.

10. The method of claim 1, wherein:
the layer of radiation sensitive material is further defined as a layer of negative radiation sensitive material.

11. The method of claim 1, wherein:
the step of exposing the layer of radiation sensitive material to radiation of dosage varying on an analog scale from a radiation source is performed by scanning the radiation source over the layer of radiation sensitive material with the dosage of the radiation changing as a function of the position of the radiation source relative to the layer of radiation sensitive material.

12. The method of claim 1, wherein:
the step of exposing the layer of radiation sensitive material to radiation of dosage varying on an analog scale from a radiation source is performed by scanning the radiation source over the layer of radiation sensitive material with a dwell time of the radiation source changing as a function of the position of the radiation source relative to the layer of radiation sensitive material.

13. The method of claim 1, wherein:
the step of exposing the layer of radiation sensitive material to radiation of dosage varying on an analog scale from a radiation source includes modulating the radiation source by a filter which varies an intensity of the radiation.

14. The method of claim 1, further comprising:
g. removing any remainder of the layer of radiation sensitive material after the anisotropic etch.

15. The method of claim 1, wherein:
exposing the layer of radiation sensitive material is performed by utilizing a focused electron beam.

16. The method of claim 1, wherein:
exposing the layer of radiation sensitive material is performed by utilizing a focused laser beam.

17. The method of claim 1, wherein:
exposing the layer of radiation sensitive material is performed by utilizing a focused ion beam.

18. The method of claim 1, wherein:
the attenuating material creates a phase shift in the radiation which is transmitted through the attenuating layer.

19. The method of claim 1, wherein:
the layer of attenuating material is further defined as a layer of diamond-like carbon.

20. The method of claim 1, wherein:
the layer of attenuating material is further defined as a layer of metal.

21. The method of claim 1, wherein:
the attenuating material is further defined as:
material which allows the amplitude to be matched to the phase shift required by increasing a phase shift modulo $2\pi$ and increasing a thickness of the material.

22. A method of fabricating a mask for use in patterning a radiation sensitive layer in a lithographic printer comprising the steps of:
providing a substantially transmissive substrate;
coating the substrate with a first layer of attenuating material which attenuates amplitude;
coating the first layer of attenuating material with a first layer of radiation sensitive material;
exposing the first radiation sensitive layer to radiation of a first dosage varying on an analog scale from a radiation source;
developing the first layer of radiation sensitive material to reveal a surface relief profile corresponding directly or inversely to the first dosage;
transferring the surface relief profile in the first layer of radiation sensitive material into the layer of attenuating material by an anisotropic etch;
coating the substrate and first layer of attenuating material with a second layer of attenuating material which attenuates phase shift;
coating the second layer of attenuating material with a second layer of radiation sensitive material;
exposing the second layer of radiation sensitive material to radiation of a second dosage varying on an analog scale from a radiation source;
developing the second layer of radiation sensitive material to reveal a surface relief profile corresponding directly or inversely to the second dosage; and
transferring the surface relief profile in the second radiation sensitive layer into the second attenuating layer by an anisotropic etch.

* * * * *